(12) United States Patent
Jones

(10) Patent No.: US 6,563,340 B1
(45) Date of Patent: May 13, 2003

(54) ARCHITECTURE FOR IMPLEMENTING TWO CHIPS IN A PACKAGE

(75) Inventor: Christopher W. Jones, Pleasanton, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/862,668

(22) Filed: May 21, 2001

(51) Int. Cl.[7] .............................................. H01L 25/00
(52) U.S. Cl. ........................................ 326/41; 326/101
(58) Field of Search ........................... 326/101, 41, 39

(56) References Cited

U.S. PATENT DOCUMENTS

| | | | |
|---|---|---|---|
| 5,642,262 A | 6/1997 | Terrill et al. | 361/783 |
| 6,157,213 A | * 12/2000 | Voogel | 326/41 |
| 6,225,821 B1 | * 5/2001 | Davidson | 326/41 |

FOREIGN PATENT DOCUMENTS

EP 0596658 A1 * 5/1994

* cited by examiner

*Primary Examiner*—Daniel Chang
(74) *Attorney, Agent, or Firm*—Christopher P. Maiorana, P.C.; John J. Ignatowski

(57) ABSTRACT

A device having two or more programmable logic devices within an assembly apparatus. A first programmable logic device may be configured to have (i) a first signal interface and (ii) a second signal interface. A second programmable logic device may be configured to have (i) a third signal interface and (ii) a fourth signal interface. The assembly apparatus is generally configured to (i) mount the first programmable logic device and (ii) mount the second programmable logic device. A first external contact may be connected to the first signal interface. A second external contact may be connected to the fourth signal interface. A direct connection may be provided between the second signal interface and the third signal interface.

20 Claims, 6 Drawing Sheets

ARCHITECTURE FOR IMPLEMENTING TWO CHIPS IN A PACKAGE

FIELD OF THE INVENTION

The present invention relates to a method and/or architecture for a package integrating multiple chips generally and, more particularly, to a package having multiple programmable logic devices interconnected with each other.

BACKGROUND OF THE INVENTION

A design cycle for a newer and larger complex programmable logic device (CPLD) can require several months to complete. Considerable resources must be spent in design, simulations, and test cycles for the new CPLD prior to producing a working prototype in silicon. After the working prototypes are available, additional resources can be expended for additional testing.

While the new CPLD is being developed, customers must use multiple existing CPLD devices to meet design requirements for a number of gates greater than in an individual CPLD device. Using multiple CPLD devices requires additional time and effort to segregate functionality among the CPLD devices, program the individual CPLD devices, and assemble the individual CPLD devices onto the boards. Multiple CPLD devices can consume greater power and require more board space that a single CPLD device.

SUMMARY OF THE INVENTION

The present invention concerns a device having two or more programmable logic devices within an assembly apparatus. A first programmable logic device may be configured to have (i) a first signal interface and (ii) a second signal interface. A second programmable logic device may be configured to have (i) a third signal interface and (ii) a fourth signal interface. The assembly apparatus is generally configured to (i) mount the first programmable logic device and (ii) mount the second programmable logic device. A first external contact may be connected to the first signal interface. A second external contact may be connected to the fourth signal interface. A direct connection may be provided between the second signal interface and the third signal interface.

The objects, features and advantages of the present invention include providing a package having multiple programmable logic devices that may provide for (i) a high gate density, (ii) inter-PLD communications within the package, and/or (iii) external access to the inter-PLD communications.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
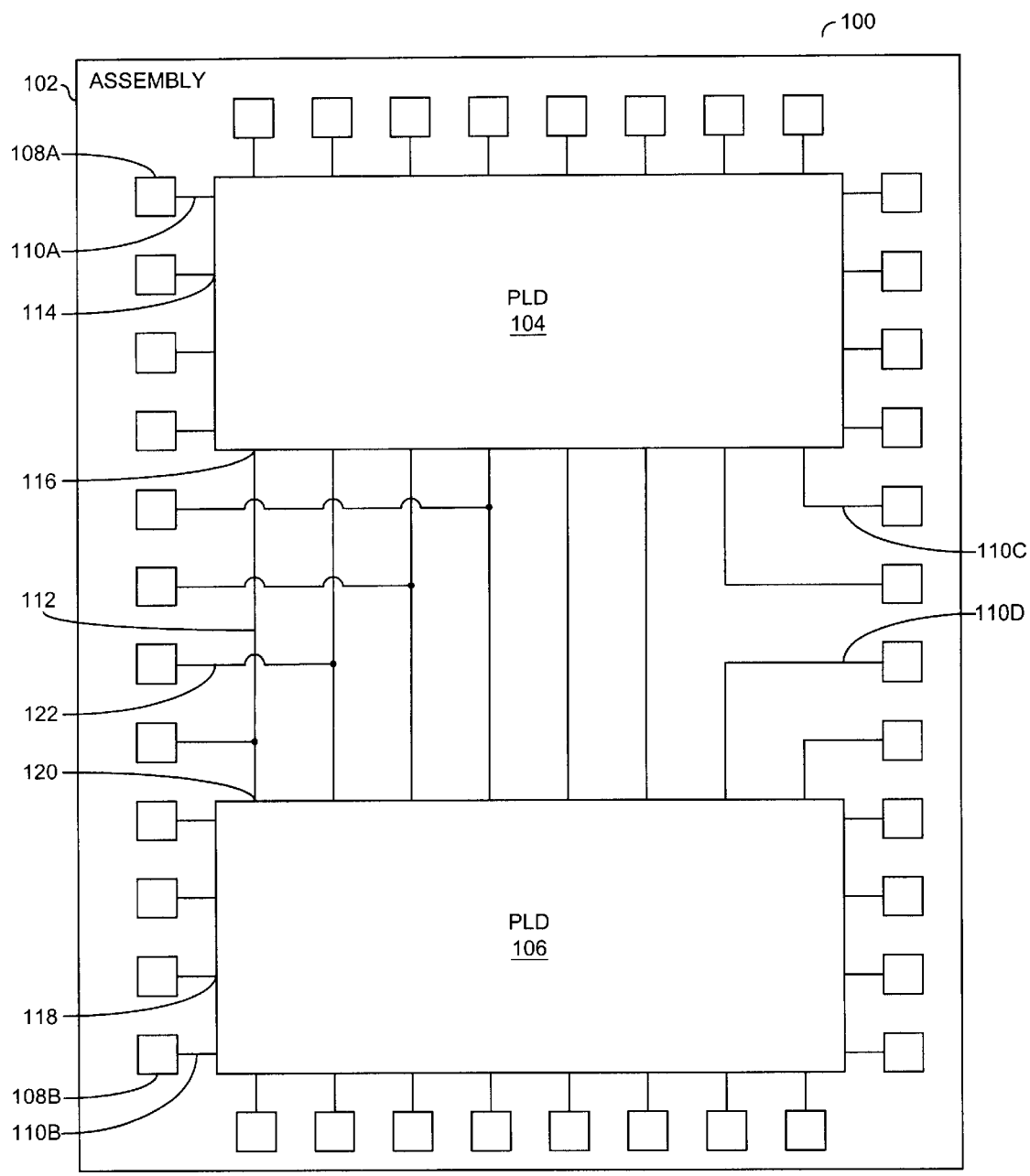
FIG. 1 is a block diagram of a device having two PLDs.

Referring to FIG. 1, a block diagram of a device 100 is shown in accordance with a preferred embodiment of the present invention. The device 100 generally comprises an assembly apparatus (or assembly) 102, a die (or chip) 104, another die (or chip) 106, and multiple external contacts 108A–B. The assembly 102 may include multiple traces 110A–B that route signals, power, ground, clocks, and the like among the die 104, the die 106 and the external contacts 108A–B. The assembly 102 may also include one or more traces 112 that route signals between the die 104 and the die 106. In one embodiment, the traces 112 may be wire-bond wires, ribbons, beams, or equivalent that may form direct connections among the die 104, the die 106, and the external contacts 108A–B.

The die 104 may have multiple interfaces 114 for exchanging signals, power, grounds, clocks, and the like with the external contacts 108A. The interfaces 114 may be wire-bonded to pads (not shown) at the end of the traces 110A adjacent to the die 104. The die 104 may have one or more interfaces 116 for exchanging signals with the die 106. The signal interfaces 116 may be wire-bonded to pads (not shown) at the end of the traces 112 adjacent to the die 104.

The die 106 may have multiple interfaces 118 for exchanging signals, power, ground, clocks, and the like with the external contacts 108B. The interfaces 118 may be wire-bonded to pads (not shown) at the end of the traces 110B adjacent to the die 106. The die 106 may have one or more interfaces 120 for exchanging signals with the die 104. The signal interface 120 may be wire-bonded to pads (not shown) at the end of the traces 112 adjacent to the die 106. In one embodiment, the signal interfaces 116 may be wire-bonded directly to the signal interfaces 120 independently of the assembly 102.

In one embodiment, the die 104 and the die 106 may be oriented so that the signal interfaces 116 and the signal interfaces 120 are on sides facing each other. In another embodiment, the signal interfaces 116 and the signal interfaces 120 may be on non-facing sides of the die 104 and the die 106. In still another embodiment, the signal interfaces 116 and the signal interfaces 120 may be distributed among facing and non-facing sides of the die 104 and the die 106.

The assembly 102 may have multiple layers that may allow traces to cross. In particular, the assembly 102 may include one or more traces 122. Each trace 122 may connect a trace 112 to an external contact 108. Each trace 122 may allow inter-die signals to be shared with the external contacts 108. In one embodiment, a signal interface 116 and a signal interface 120 may be wired bonded directly to an external contact 108 thus forming a three-node connection.

The assembly 102 may include one or more traces 110C along the same side of the die 104 as the signal interfaces 116. The assembly 102 may also include one or more traces 110D along the same side of the die 106 as the signal interfaces 120. The traces 110C–D may be used to provide additional external connections in applications where there are more than sufficient signal interfaces 116 and/or signal interfaces 120 to meet an inter-die communication requirement for the device 100.

The assembly 102 may be implemented having a single conductive layer or multiple-conductive layers. The assembly 102 may be a substrate, a carrier, a lead frame, a housing, a base, or other equivalent structure. The die 104 may be implemented as a programmable logic device (PLD) or a complex programmable logic device (CPLD). The die 106 may be implemented as another PLD or CPLD. The die 104 and the die 106 may be similar to each other or different types and/or sizes of PLD/CPLDs. The external contacts 108 may be implemented as pins, balls, land grid, bumps, leads, solder joint pads, or the like.

Figure 2:
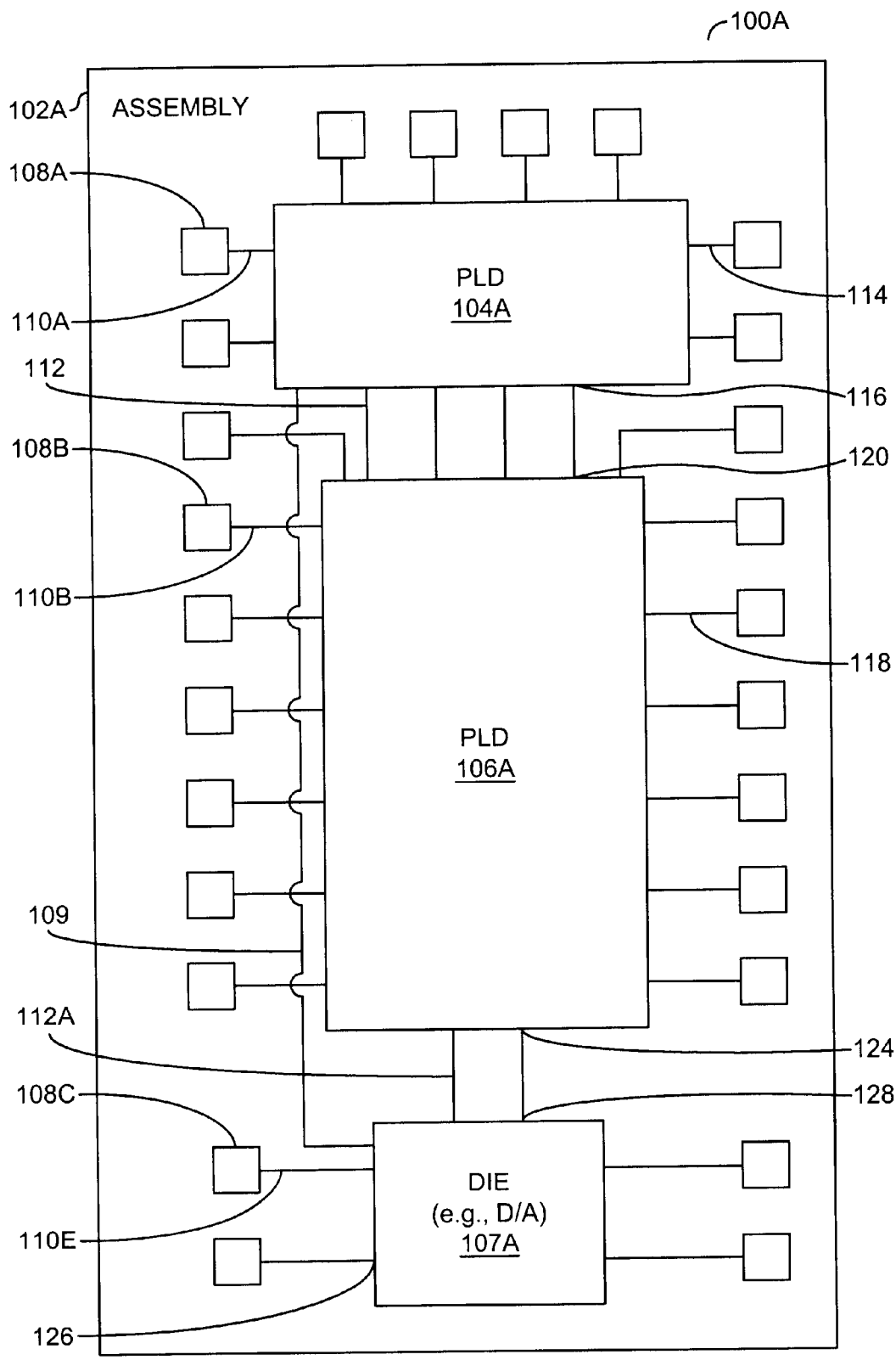
FIG. 2 is a block diagram of another device having multiple die.
Figure 3:
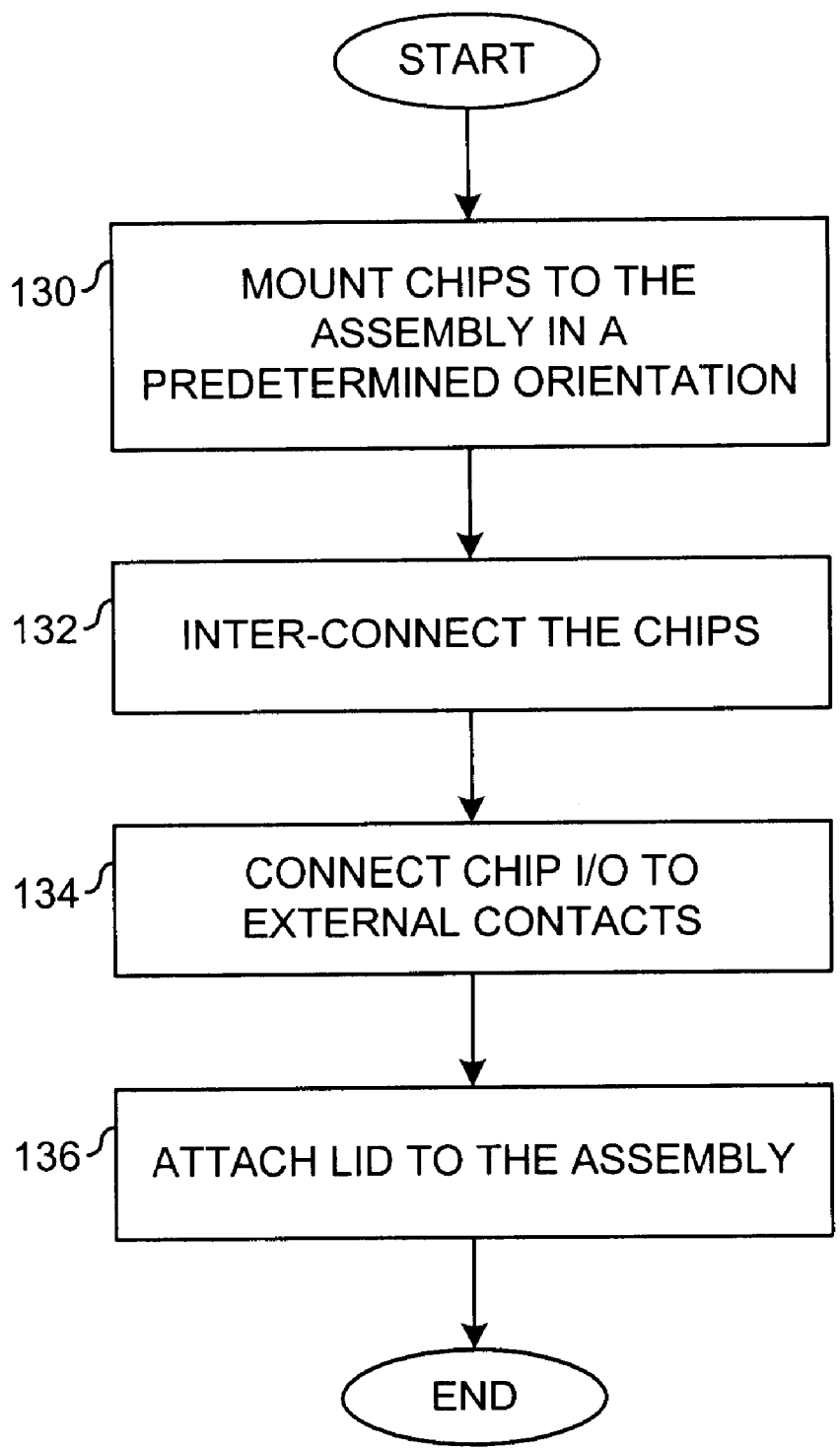
FIG. 3 is a flow diagram of a method of fabricating the device.

Referring to FIG. 2, a block diagram of a device 100A implementing an alternative embodiment is shown. The device 100A generally includes an assembly 102A, a die 104A, a die 106A, a die 107A, and multiple external contacts 108A–C. The assembly 102A may include the traces 110A–B, 110E and the traces 112. The traces 110A–C and 110E may route between the external contacts 108 and the die 104A, the die 106A, and the die 107A. The assembly 102A may include one or more additional inter-die traces 112A between the die 106A and the die 107A. In one embodiment, additional traces 109 may be included within the assembly 102A to route signals between the die 104A and the die 107A to meet the design criteria of a particular implementation. Generally, one or more additional dies may be mounted on the assembly 102A along with the die 104A and the die 106B.

The die 104A may include the interfaces 114 to exchange signals, power, ground, clocks, and the like with the external contacts 108A. The die 104A may include the signal interfaces 116 to exchange signals with the die 106A. The die 106A may include the interfaces 118 to exchange signal, power, ground, clocks, and the like with the external contacts 108B. Thedie 106A may include the signal interfaces 120 to exchange signals with the die 104A. The die 106A may also include one or more interfaces 124 to exchange signals with the die 107A.

The die 107A may include multiple interfaces 126 to exchange signals, power, ground, clocks, and the like with the external contacts 108C. The interfaces 126 may be wire-bonded to pads (not shown) at the ends of the traces 110E adjacent to the die 107A. The die 107A may have one or more interfaces 128 to exchange signals with the die 106A. The signal interfaces 128 may be wire-bonded to the pads (not shown) at the ends of the traces 112A adjacent to the die 107A. In one embodiment, the traces 112A may be wire-bond wires, ribbon, beams, or equivalent connected directly between the die 106A and the die 107A. Likewise, the traces 110E between the die 107A and the external contacts 108C may be implemented independently of the assembly 102A.

The die 107A may be implemented as another PLD or CPLD. The die 107A may be similar to the die 104A, similar to the die 106A, or a different type and/or size of PLD/CPLD. In other embodiments, the die 107A may be a bus interface chip, a memory, a processor, an analog to digital converter, a digital to analog converter, field programmable gate array, application specific integrated circuit, digital signal processor, or any other device compatible with the interfaces 124.

Referring to FIG, 3, a flow diagram of a process of assembling the device 100 is shown. The process may begin by orienting and mounting the die (chips) 104 and 106 to the assembly 102 (e.g., block 130). Once the die 104 and 106 are mounted, the die 104 and 106 may be connected to each other (e.g., block 132). As mentioned earlier, interconnecting the die may be accomplished by wire bonding to traces 112 in the assembly 102 and/or wiring directly from pad to pad between the die 104 and 106. The die 104 and 106 may also be connected to the external contacts 108A-D (e.g. block 134). Connections to the external contacts 108A–B tnay be made by wire-bonding to traces 110A–D in thlo assembly 102 and/or wiring directly between the die pads and the external contacts 108A–B. The sequence of connecting the die 104 and 106 to the external contacts 108A–B and to each other may be performed in any order. After all of the connections have been made, a lid may be attached to the assembly to protect the dies 104 and 106 and wire-bonds (e.g., block 136).

Figure 4:
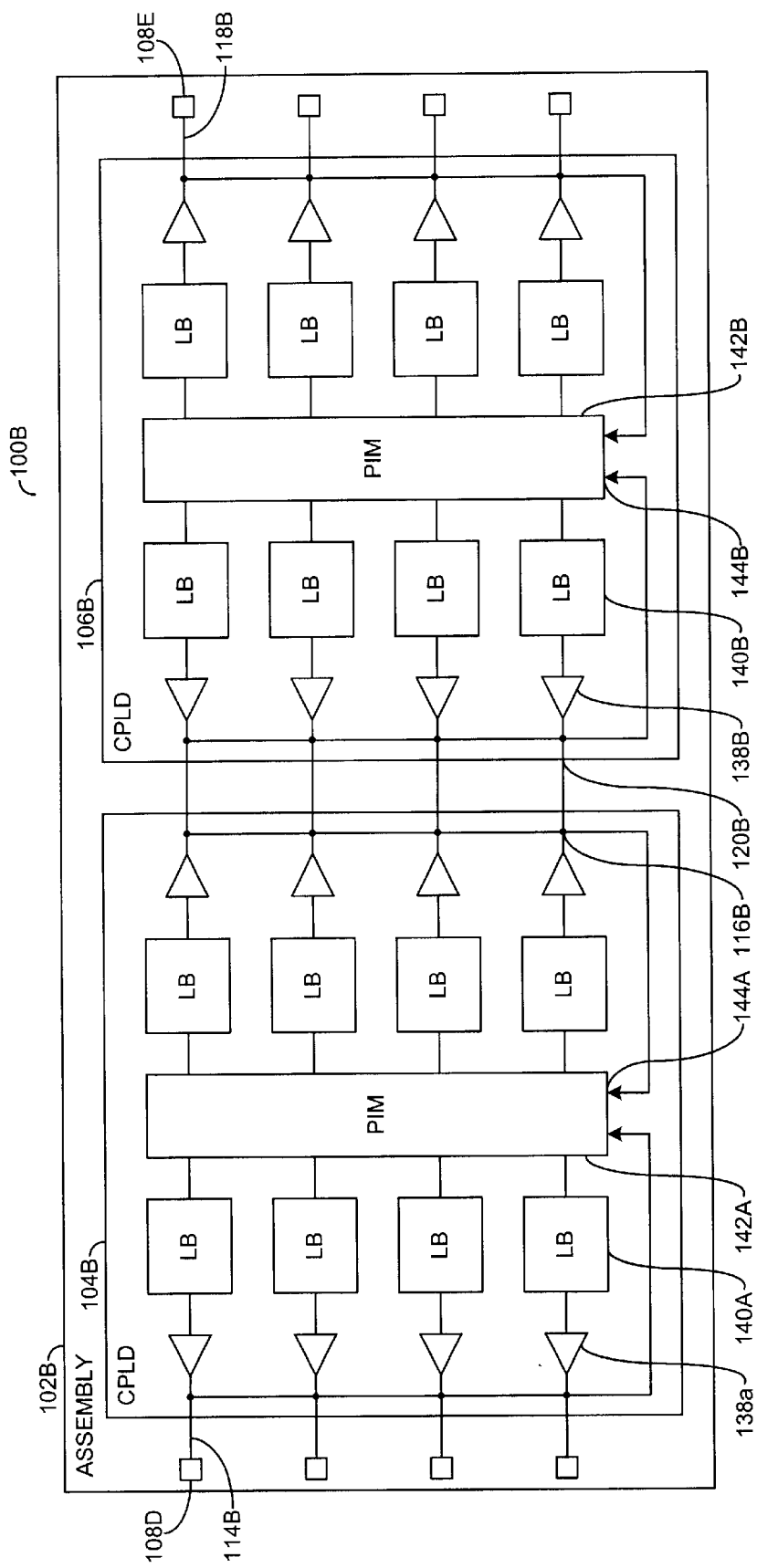
FIG. 4 is a block diagram of a first embodiment of the present invention.

Referring to FIG. 4, a block diagram of a device 100B illustrating an example implementation is shown. The device 100B may be implemented using CPLDs of the Ultra37000™ family of CPLDs. available from Cypress Semiconductor of San Jose, Calif. The device 100B generally comprises an assembly 102B, a first CPLD 104B, and a second CPLD 106B. The CPLD 104B and the CPLD 106B are shown as similar parts. In other embodiments, the CPLD 104B may be a different part than the CPLD 106B.

Each CPLD 104B and 106B generally comprises multiple buffers 138A–B, multiple logic blocks (LB) 140A–B, and a programmable interconnect matrix (PIM) 142A–B. The CPLD 104B may have multiple interfaces 114B connected to the external contacts 108D. The CPLD 104B may have multiple signal interfaces 116B connected to the CPLD 106B. The PIM 142A of the CPLD 104B may have an interface 144A that may receive the signals present at the interfaces 114B and the signal interfaces 116B.

The CPLD 106B may have multiple interfaces 118B connected to the external contacts 108E. The CPLD 106B may have multiple signal interfaces 120B connected to the signal interfaces 116B of the CPLD 104B. The PIM 142B of the CPLD 106B may have the interface 144B that may receive the signals present at the interfaces 118B and the signal interfaces 120B.

The interfaces 114B, 116B, 118B and 120B as shown in FIG. 4 may represent several interfaces 114, 116, 118 and 120 as shown in FIG. 1 and FIG. 2. Consequently, each buffer 138A–B shown in FIG. 4 may represent several buffers, one for each individual signal or bit of the signal presented by a logic block 140A–B. Likewise, each external contact 108D–E as shown in FIG. 4 may represent several external contacts 108A–B as shown in FIG. 1 and FIG. 2 to accommodate the multiple-bit signals.

The CPLD 104B may communicate with the CPLD 106B by generating a signal in a sending logic block 140A. The signal may then be presented at a signal interface 116B by a buffer 138A associated with the sending logic block 140A. The CPLD 106B may receive the signal at a signal interface 120B connected to the signal interface 116B. The signal may then be routed to interface 144B of the PIM 142 of the CPLD 106B. The PIM 142B may route the signal to a receiving logic block 140B in the CPLD 106B. The same basic process may be used to send a signal from the CPLD 106B to the CPLD 104B.

Figure 5:
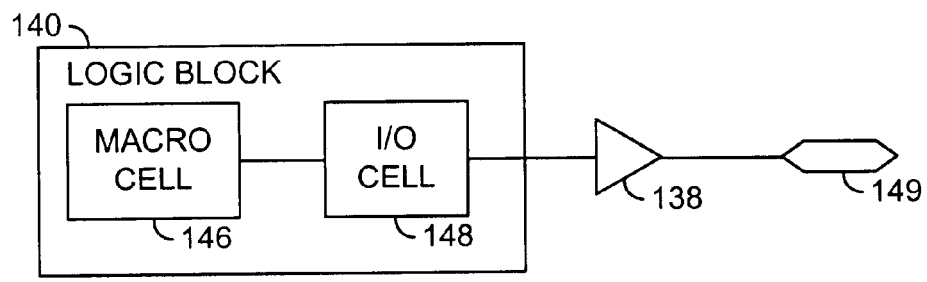
FIG. 5 is a detailed block diagram of a portion of a CPLD of FIG. 4.

Referring to FIG. 5, a detailed block diagram of a portion of a logic block 140 is shown. Each logic block 140 may include a macrocell 146 and an input/output (I/O) cell 148. The macrocell 146 may be connected to the I/O cell 148 to present a single-bit or multiple-bit signal. The I/O cell 148 may be connected to the buffer 138. The buffer 138 may be connected to an interface 149 to present the signal. The interface 149 may represent the interfaces 114B, 116B, 118B and 120B.

Programming of inter-die communications between the CPLD 104B and the CPLD 106B may be flexible due to the PIMs 142. Each logic block 140 directly associated with a signal interface 116B or 120B may present a signal to the PIM 142 of the other CPLD. The PIM 142 receiving the signal may route the signal to any of the logic blocks 140 within the same CPLD. Thus, several logic blocks 140 of a CPLD may send signals to any of the logic blocks 140 of the other CPLD.

Figure 6:
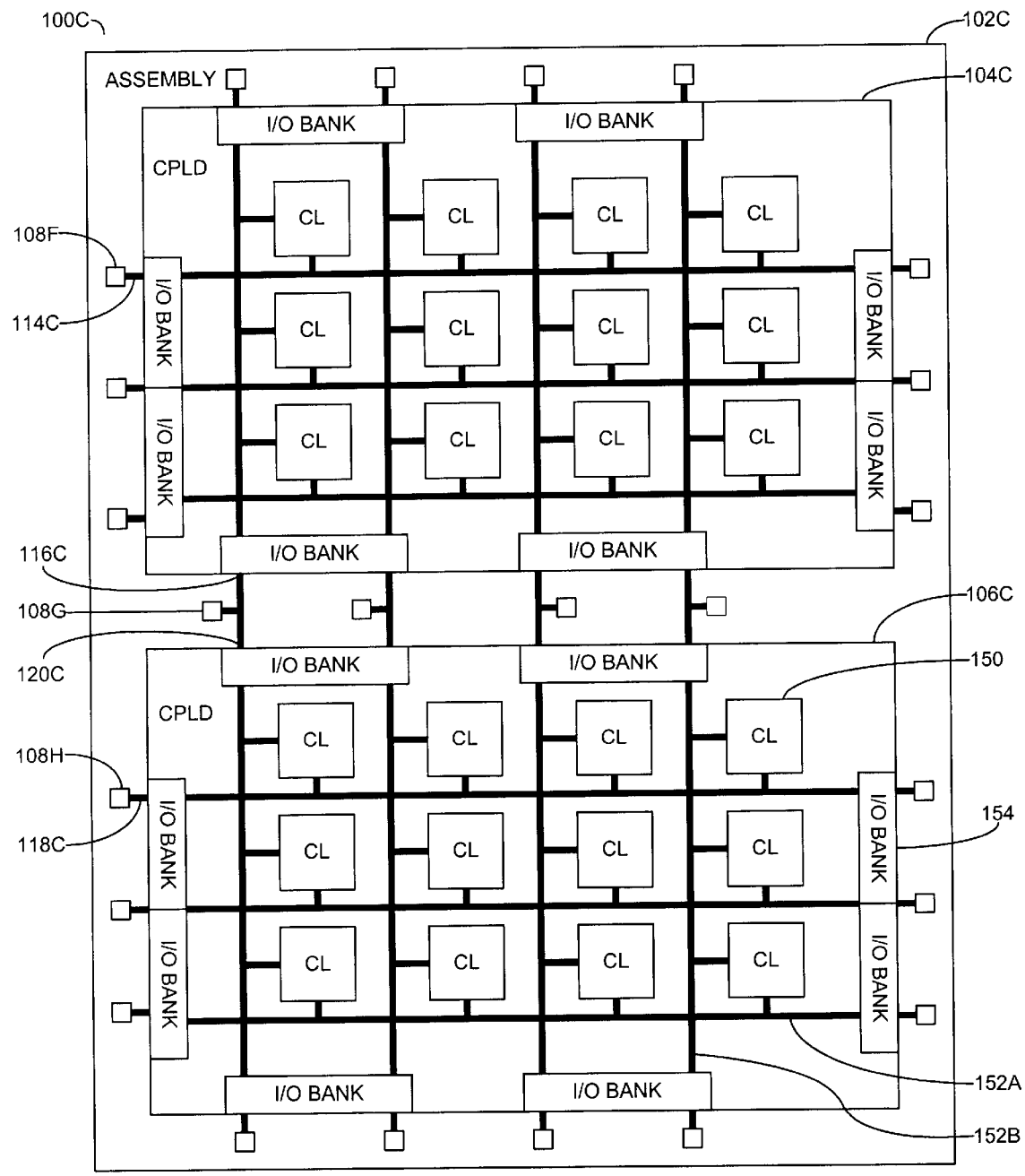
FIG. 6 is a block diagram of a second embodiment of the present invention.

Referring to FIG. 6, a block diagram of a device 100C illustrating another example implementation is shown. The device 100C may be implemented using CPLDs of the Delta39K™ family of CPLDs available from Cypress Semiconductor of San Jose, Calif. The device 100C generally comprises an assembly 102C, a first CPLD 104C, and a second CPLD 106C. The CPLD 104C and the CPLD 106C are shown as similar parts. In other embodiments, the CPLD 104C may be a different part than the CPLD 106C.

Each CPLD 104C and 106C generally comprises multiple clusters (CL) 150, multiple channels 152A–B, and multiple I/O banks 154. The CPLD 104C may have multiple interfaces 114C connected to the external contacts 108F. The CPLD 104C may have multiple signal interfaces 116C connected to the CPLD 106C. One or more of the signal interfaces 116C may also be Connected to the external contacts 108G.

The CPLD 106C may have multiple interfaces 118C connected to the external contacts 108H. The CPLD 106C may have multiple signal interfaces 120C connected to the signal interfaces 116C of the CPLD 104C. One or more of thegnal interfaces 120C may also be connected to the external contacts 108G.

The interfaces 114C, 116C, 118C and 120C as shown in FIG. 6 may represent several interfaces 114, 116, 118 and 120 as shown in FIG. 1 and FIG. 2. As a result, each external contact 108C as shown in FIG. 6 may represent several external contacts 108 as shown in FIG. 1 and FIG. 2 to accommodate multiple-bit signals.

The CPLD 104C may communicate with the CPLD 106C by generating a signal in a cluster 150. The signal may be programmably routed through the channels 152 to an I/O bank 154. The I/O bank 154 may present the signal to another I/O bank 154 within the CPLD 106C. The I/O bank 154 of the CPLD 106C may programmably route the signal to any cluster 150 of the CPLD 106C.

The same basic process may be used to send a signal from the CPLD 106C to the CPLD 104C.

Figure 7:
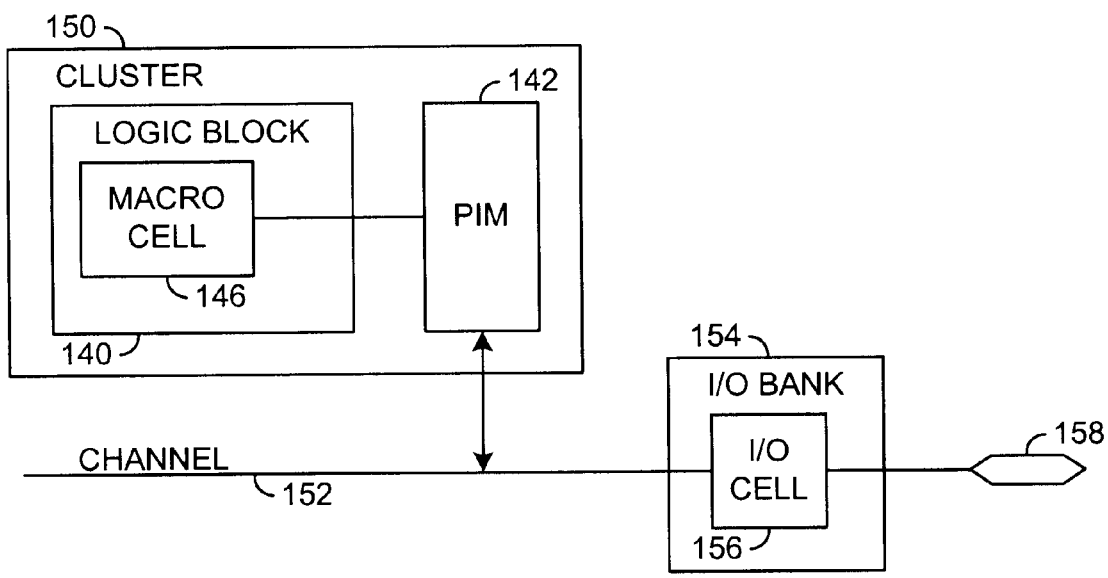
FIG. 7 is a detailed block diagram of a portion of a CPLD of FIG. 6.

Referring to FIG. 7, a detailed block diagram of a cluster 150 and an I/O bank 154 is shown. Each cluster 150 generally comprises several logic blocks 140 (only one is shown for clarity) and a PIM 142. As before, each logic block 140 may include several macrocells 146 (only one shown for clarity). Each I/O bank 154 generally comprises several I/O cells 156 (only one is shown for clarity). A multiple-bit interface 158 may connect an I/O cell 156 externally to the CPLD. The interfaces 158 may represent the interfaces 114C, 116C, 118C and 120C. The channels 152 may programmably interconnect the PIM 142 with the I/O cell 156. The PIM 142 and the I/O cells 156 may exchange signals in either direction thus allowing the macrocell 146 to send and receive to and from the interface 158.

The channels 152 may provide for very flexible inter-die communications between the CPLD 104C and the CPLD 106C. The channels 152 may be programmed so that any macrocell 146 in any logic block 140 in any cluster 150 may be connected with any I/O cell 156 in any I/O bank 154. As a result, any macrocell 146 in the CPLD 104C may communicate with any other macrocell 146 in the CPLD 106C using any signal interfaces 116C and 120C.

The I/O cells 156 may contribute to the flexibility of the inter-die communications between the CPLD 104C and the CPLD 106C. The I/O cells 156 may be capable of programmably enabling/disabling individual lines of the interface 158. Furthermore, the I/O cells 156 may be capable of programmably defining the direction (input or output) of the individual lines of the interface 158. As a result, each multiple-bit interface 158 may convey several signals simultaneously on different lines. The various signals may also be routed in different directions simultaneously with some being received by the I/O cell 156 and some being presented by the I/o cell 156.

The various signals of the present invention may be implemented as single-bit or multi-bit signals in a serial and/or parallel configuration. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. A device comprising:
   a first programmable logic device disposed in a first die and configured to have (i) a first signal interface and (ii) a second signal interface;
   a second programmable logic device disposed in a second die and configured to have (i) a third signal interface and (ii) a fourth signal interface;
   an assembly apparatus configured to (i) mount said first programmable logic device and (ii) mount said second programmable logic device;
   a first external contact of said assembly apparatus connected to said first signal interface;
   a second external contact of said assembly apparatus connected to said fourth signal interface;
   a third external contact of said assembly apparatus connected to said second signal interface and said third signal interface; and
   a direct connection between said second signal interface and said third signal interface.

2. The device according to claim 1, wherein said second signal interface and said third signal interface are on facing sides of said first programmable logic device and said second programmable logic device.

3. The device according to claim 1, further comprising a fourth external contact of said assembly apparatus connected to a fifth signal interface on a same side of said first programmable logic device as said second signal interface.

4. The device according to claim 3, further comprising a trace of said assembly apparatus disposed between said first programmable logic device and said second programmable logic device to connect said fourth external contact to said fifth signal interface.

5. The device according to claim 1, further comprising:
   a third die configured to have a fifth signal interface; and
   a second direct connection between said fifth signal interface and a sixth signal interface of said second programmable logic device.

6. The device according to claim 5, further comprising a fourth external contact of said assembly apparatus connected to a seventh signal interface of said third die.

7. The device according to claim 6, wherein said third die comprises a third programmable logic device.

8. The device according to claim 5, further comprising a third direct connection between said first programmable logic device and said third die.

9. The device according to claim 5, wherein said third die comprises analog circuitry.

10. The device according to claim 1, wherein said second signal interface is non-programmably connected to a predetermined macrocell within said first programmable logic device.

11. The device according to claim 1, wherein said second signal interface is programmably connectable to a macrocell within said first programmable logic device.

12. The device according to claim 1, wherein said first programmable logic device comprises a plurality of logic blocks.

13. A device comprising:
   means for mounting a first programmable logic device disposed in a first die and having a first signal interface and a second signal interface to an assembly apparatus;
   means for mounting a second programmable logic device disposed in a second die and having a third signal interface and a fourth signal interface to said assembly apparatus;
   means for connecting a first external contact of said assembly apparatus to said first signal interface;
   means for connecting a second external contact of said assembly apparatus to said fourth signal interface;
   means for connecting a third external contact of said assembly apparatus to said second signal interface and said third signal interface; and
   means for directly connecting said second signal interface directly to said third signal interface.

14. A method of fabricating a device comprising the steps of:
   (A) mounting a first programmable logic device disposed in a first die and having a first signal interface and a second signal interface to an assembly apparatus;
   (B) mounting a second programmable logic device disposed in a second die and having a third signal interface and a fourth signal interface to said assembly apparatus;
   (C) connecting a first external contact of said assembly apparatus to said first signal interface;
   (D) connecting a second external contact of said assembly apparatus to said fourth signal interface;
   (E) connecting a third external contact of said assembly apparatus to said second signal interface and said third signal interface; and
   (F) connecting said second signal interface to said third signal interface.

15. The method according to claim 14, further comprising the step of orienting said first programmable logic device and second programmable logic device such that said second signal interface and said third signal interface are on facing sides of said first programmable logic device and said second programmable logic device.

16. The method according to claim 14, further comprising the step of connecting a fourth external contact of said assembly apparatus to a fifth signal interface on a same side of said first programmable logic device as said second signal interface.

17. The method according to claim 14, further comprising the steps of:
   mounting a third die having a fifth signal interface to said assembly apparatus; and
   directly connecting said fifth signal interface to a sixth signal interface of said second programmable logic device.

18. The method according to claim 17, further comprising the step of connecting a fourth external contact of said assembly apparatus to a seventh signal interface of said third die.

19. The method according to claim 17, further comprising the step of directly connecting said third die to said first programmable logic device.

20. The method according to claim 14, wherein said first programmable logic device comprises a plurality of logic blocks.

* * * * *